(12) United States Patent
Kim et al.

(10) Patent No.: US 12,477,899 B2
(45) Date of Patent: Nov. 18, 2025

(54) ORGANIC LIGHT EMITTING DISPLAY DEVICE FOR REDUCING LEAKAGE CURRENT IN OFF STATE

(71) Applicant: LG Display Co., Ltd., Seoul (KR)

(72) Inventors: Kyung-Su Kim, Paju-si (KR);
Kyung-Mo Son, Paju-si (KR);
Eun-Sung Kim, Paju-si (KR)

(73) Assignee: LG Display Co., Ltd., Seoul (KR)

(*) Notice: Subject to any disclaimer, the term of this patent is extended or adjusted under 35 U.S.C. 154(b) by 522 days.

(21) Appl. No.: 17/882,411

(22) Filed: Aug. 5, 2022

(65) Prior Publication Data
US 2023/0065335 A1    Mar. 2, 2023

(30) Foreign Application Priority Data
Aug. 30, 2021 (KR) .................. 10-2021-0114584

(51) Int. Cl.
*H10K 59/121* (2023.01)
*H10D 30/67* (2025.01)
(Continued)

(52) U.S. Cl.
CPC ..... *H10K 59/1213* (2023.02); *H10D 30/6755* (2025.01); *H10K 50/865* (2023.02); *H10K 59/1216* (2023.02); *H10K 59/131* (2023.02)

(58) Field of Classification Search
CPC ............ H10K 59/1213; H10K 50/865; H10K 59/1216; H10K 59/131; H10K 59/126; H10D 30/6755; H10D 30/6723; H10D 86/451; H10D 86/481; H10D 86/423; H10D 86/60; G09G 3/3225; G09G 2300/0426
See application file for complete search history.

(56) References Cited

U.S. PATENT DOCUMENTS 11,138,929 B2   10/2021   Park et al.
11,417,867 B2   8/2022    Lim et al.
(Continued)

FOREIGN PATENT DOCUMENTS

JP       2020-181194 A    11/2020
KR   10-2019-0108224 A    9/2019
(Continued)

OTHER PUBLICATIONS

The Japan Patent Office, Office Action, Japanese Patent Application No. 2022-136376, Aug. 8, 2023, 20 pages.
(Continued)

*Primary Examiner* — Jacob Y Choi
*Assistant Examiner* — Grace Cha
(74) *Attorney, Agent, or Firm* — Fenwick & West LLP (57) ABSTRACT

The present invention relates to a hybrid organic light emitting display device including a driving thin film transistor having an oxide semiconductor pattern and a switching thin film transistor having an oxide semiconductor pattern or a polycrystalline semiconductor pattern in a driving device unit for driving a unit pixel, in which a light blocking layer below an active layer is electrically connected to a source electrode to form the driving thin film transistor with wide control range at low gradation and the light blocking layer is disposed as close as possible to the active layer to broaden the control range of the driving thin film transistor.

26 Claims, 5 Drawing Sheets

(51) Int. Cl.
*H10K 50/86* (2023.01)
*H10K 59/131* (2023.01)

(56) References Cited

U.S. PATENT DOCUMENTS

| | | | |
|---|---|---|---|
| 11,594,587 B2 | 2/2023 | Son et al. | |
| 2016/0064421 A1* | 3/2016 | Oh | H10D 30/6745 257/43 |
| 2017/0338252 A1 | 11/2017 | Lee et al. | |
| 2019/0189975 A1* | 6/2019 | Lim | H10K 77/111 |
| 2020/0111855 A1 | 4/2020 | Bae et al. | |
| 2020/0135772 A1* | 4/2020 | Lee | H10K 59/131 |
| 2020/0402467 A1* | 12/2020 | Choi | H10K 59/1201 |
| 2021/0036029 A1* | 2/2021 | Park | H10D 86/471 |
| 2021/0056898 A1 | 2/2021 | Park et al. | |
| 2021/0066421 A1 | 3/2021 | Son et al. | |
| 2021/0151475 A1* | 5/2021 | Kim | H10D 86/0223 |
| 2022/0344626 A1 | 10/2022 | Lim et al. | |

FOREIGN PATENT DOCUMENTS

| | | |
|---|---|---|
| KR | 10-2021-0022187 A | 3/2021 |
| KR | 10-2021-0027654 A | 3/2021 |

OTHER PUBLICATIONS

European Patent Office, Extended European Search Report and Opinion, EP Patent Application No. 22190968.2, Feb. 24, 2023, ten pages.

* cited by examiner

ORGANIC LIGHT EMITTING DISPLAY DEVICE FOR REDUCING LEAKAGE CURRENT IN OFF STATE

CROSS-REFERENCE TO RELATED APPLICATION

This application claims the benefit of Republic of Korea Patent Application No. 10-2021-0114584, filed on Aug. 30, 2021, which is hereby incorporated by reference in its entirety.

BACKGROUND

Field of the Disclosure

The present invention relates to an organic light emitting display device, and more particularly, to the organic light emitting display device including a plurality of hybrid thin film transistors using different types of semiconductor materials for a driving device portion of a unit pixel.

Description of the Background

Since the organic light emitting display device uses a light emitting diode that emits light without using a backlight compared to a liquid crystal display device, it is a trend in the display field due to its excellent thin film and image quality.

In particular, the organic light emitting display device, since a light emitting diode can be formed on a flexible substrate, a screen can be configured in various forms, such as bending or folding.

Further, due to its excellent thin film properties, it is suitable as a display device for small electronic products such as smart watches.

In order to be applied to the display device such as the smart watch with many still screens, the light emitting display device having a new type of driving device unit capable of preventing leakage current in a still screen has been required.

As the thin film transistor advantageous for blocking leakage current, the thin film transistor using an oxide semiconductor as an active layer has been proposed.

However, the display device using the hybrid type thin film transistor uses different types of semiconductor layers, for example, a polycrystalline semiconductor layer and an oxide semiconductor layer. Therefore, since the process of forming the polycrystalline semiconductor layer and the process of forming the oxide semiconductor layer must be separately performed, the process is complicated. Further, since the polycrystalline semiconductor layer and the oxide semiconductor layer have different characteristics with respect to a chemical gas, the process is more complicated.

Since the mobility of carriers such as electrons and holes in the polycrystalline semiconductor layer is faster than that of the oxide semiconductor layer, the polycrystalline semiconductor layer is suitable for a driving thin film transistor requiring fast driving. As a result, the driving thin film transistor typically uses the polycrystalline semiconductor layer.

However, the driving thin film transistor using the polycrystalline semiconductor layer has a high driving speed but a large current fluctuation rate due to current stress, and thus has a disadvantage in expressing low grayscale. Accordingly, an object of the present invention is to provide a driving device including the driving thin film transistor using an oxide semiconductor, and having a small current variation rate after current stress and a large s-factor value.

SUMMARY

In order to achieve the objection, an organic light emitting display device comprises a plurality of pixels including a light emitting device connected to a data line crossing with a gate line, a driving transistor disposed at each pixel, the driving transistor having a first oxide semiconductor pattern and supplying driving current to the light emitting device according to a data voltage applied from the data line, and a plurality of switching transistor disposed at each pixel, the switching transistors including a first switching transistor and a second switching transistor supplying the data voltage according to a gate signal applied from the gate line, wherein the second switching transistor includes a second oxide semiconductor pattern, the driving transistor includes a first light blocking layer overlapped with the first oxide semiconductor pattern at a lower portion of the first oxide semiconductor pattern and the second switching transistor includes a second light blocking layer overlapped with the second oxide semiconductor pattern in the lower portion of the second oxide semiconductor pattern, and a first distance between the first oxide semiconductor pattern and the first light blocking layer is smaller than a second distance between the second oxide semiconductor pattern and the second light blocking layer.

The first switching transistor includes a first gate electrode, a first source electrode, and a first drain electrode, and the second switching transistor includes the second oxide semiconductor pattern on an upper buffer layer, a second gate electrode overlapped with the second oxide semiconductor pattern with a second gate insulating layer interposed therebetween, a second interlayer insulating layer on the second gate electrode, and a second source electrode and a second drain electrode on the second interlayer insulating layer. The driving transistor includes the first oxide semiconductor pattern on the upper buffer layer, a third gate electrode overlapped with the first oxide semiconductor pattern with a second gate insulating layer interposed therebetween, and a third source electrode and a third drain electrode connected to the first oxide semiconductor pattern on the second interlayer insulating layer, wherein the third source electrode is connected to the first light blocking layer.

The first switching transistor may include a polycrystalline semiconductor pattern.

The first switching transistor includes the polycrystalline semiconductor pattern on a substrate, a first gate electrode overlapped with the polycrystalline semiconductor pattern with a first gate insulating layer interposed therebetween, a first interlayer insulating layer on the first gate electrode, the upper buffer layer on the first interlayer insulating layer, and a first source electrode and a first drain electrode on the upper buffer layer connected to the polycrystalline semiconductor pattern.

The first light blocking layer is disposed inside of the upper buffer layer and the second blocking layer is disposed below the upper buffer layer.

The first light blocking layer is disposed inside of the upper buffer layer and the second light blocking layer is disposed on an upper surface of the first gate insulating layer.

The organic light emitting display device further comprises a storage capacitor including a first capacitor electrode disposed on the same layer as the first gate electrode and a second capacitor electrode disposed on the same layer as the first light blocking layer.

The third source electrode may be electrically connected to the first light blocking layer.

The second gate electrode may be electrically connected to the second light blocking layer.

The upper buffer layer may include a first sub-upper buffer layer below the first light blocking layer and a second sub-upper buffer layer and a third sub-upper buffer layer on the first light blocking layer.

The second sub-upper buffer layer may cover only top surface and side surfaces of the first light blocking layer.

The second sub-upper buffer layer includes silicon nitride layer, and the first sub-upper buffer layer and the third sub-upper buffer layer include silicon oxide layer.

The first light blocking layer includes titanium (Ti).

A parasitic capacitance (Cact) generated inside of the first oxide semiconductor pattern is connected in parallel with a parasitic capacitance (Cbuf) generated between the first oxide semiconductor pattern and the first light blocking layer, and the parasitic capacitance (Cact) is connected in series with a parasitic capacitance (Cgi) generated between the third gate electrode and the first oxide semiconductor pattern.

The second capacitor electrode may be electrically connected to the third source electrode.

The organic light emitting display device according to the present invention comprises a plurality of pixels including a light emitting device connected to a data line crossing with a gate line, a driving transistor disposed at each pixel, the driving transistor having a first oxide semiconductor pattern and supplying driving current to the light emitting device according to a data voltage applied from the data line, and a first light blocking layer overlapped with the first oxide semiconductor pattern at lower portion of the first oxide semiconductor pattern, the first light blocking layer including a titanium, wherein a top surface and side surfaces of the first light blocking layer is covered by a silicon nitride layer.

The driving transistor includes the first oxide semiconductor pattern on a substrate, a gate electrode overlapped with the first oxide semiconductor pattern with a gate insulating layer interposed therebetween, at least one interlayer insulating layer over the gate electrode, and a source electrode and a drain electrode connected to the first oxide semiconductor pattern on the interlayer insulating layer, wherein the source electrode is electrically connected to the first light blocking layer.

The gate electrode may include at least one conductive layer having titanium.

The organic light emitting display device further comprises a plurality of switching transistors for supplying a data voltage according to a gate signal applied to the gate line, wherein the plurality of switching transistors include one switching transistor having a second oxide semiconductor pattern.

In still another embodiment, an organic light emitting display device comprises a plurality of pixels emitting light in a first direction, at least one of the pixels comprising a first switching transistor including a polycrystalline semiconductor pattern; a second switching transistor including a first oxide semiconductor pattern; and a driving transistor including a second oxide semiconductor pattern, a gate electrode above the second oxide semiconductor pattern in the first direction, and a first reflective, conductive layer under the second oxide semiconductor pattern in a second direction opposite the first direction, wherein the first reflective, conductive layer is electrically connected to the second oxide semiconductor pattern. The driving transistor includes a source electrode, a drain electrode, and a gate electrode; and the first reflective, conductive layer is electrically connected to the second oxide semiconductor pattern via the source electrode of the driving transistor.

In some embodiments, the at least one of the pixels further comprises an interlayer insulating layer including hydrogen particles, the interlayer insulating layer disposed above the polycrystalline semiconductor pattern of the first switching transistor in the first direction, under the first oxide semiconductor pattern of the second switching transistor in the second direction, and under both the second oxide semiconductor pattern and the first reflective, conductive layer of the driving transistor in the second direction. The interlayer insulating layer may include silicon nitride (SiNx), and the first reflective, conductive layer may include titanium.

In some embodiments, the second switching transistor further includes a second reflective, conductive layer under the first oxide semiconductor pattern in the second direction; and a first distance between the second oxide semiconductor pattern and the first reflective, conductive layer of the driving transistor is smaller than a second distance between the first oxide semiconductor pattern and the second reflective, conductive layer.

In some embodiments, the at least one of the pixels further comprises a storage capacitor including a first capacitor electrode and a second capacitor electrode; wherein the interlayer insulating layer is disposed between the first capacitor electrode and the second capacitor electrode; the first capacitor electrode is in a same layer as the second reflective, conductive layer of the second switching transistor; and the second capacitor electrode is in a same layer as the first reflective, conductive layer of the driving transistor.

DETAILED DESCRIPTION

Advantages and features of the present invention, and a method for achieving them will become apparent with reference to the embodiments described below in detail in conjunction with the accompanying drawings. However, the present invention is not limited to the embodiments disclosed below, but will be implemented in a variety of different forms, and only these embodiments allow the disclosure of the present invention to be complete, and those of ordinary skill in the art to which the present invention pertains. It is provided to inform the person of the scope of the invention. The invention is only defined by the scope of the claims.

Since the shapes, sizes, proportions, angles, numbers, etc. disclosed in the drawings for explaining the embodiments of the present invention are exemplary, the present invention is not limited to the matters shown in the drawings. Throughout the specification, like elements may be referred to by like reference numerals. In addition, when describing the present invention, if it is determined that a detailed description of a related known technology may unnecessarily obscure the subject matter of the present invention, the detailed description thereof will be omitted.

When 'including', 'having', 'consisting', etc. mentioned in this specification are used, other parts may be added unless the expression 'only' is used. When a component is expressed in the singular, the plural is included unless specifically stated otherwise.

When interpreting components, it should be interpreted as including a range of errors, even if there is no explicit description.

For example, when the positional relationship of two parts is described as 'on', 'on', 'on', 'beside', etc., the expression 'directly' or 'directly' is used Unless otherwise stated, one or more other parts may be positioned between the two parts.

Spatially relative terms "below, beneath", "lower", "Above", "upper", etc. may be used to easily describe the correlation between one element or components and another element or components as shown in the drawings. In addition to the directions shown in the drawings, relative terms should be understood as terms that include different orientations of the element during use or operation. For example, when the element shown in the figure is turned over, the other element described as "beneath" or "beneath" may be placed "above" another element. Accordingly, the exemplary term "beneath" may include both directions above and below. Likewise, the exemplary terms "above" or "on" may include both directions above and below.

In the case of a description of a temporal relationship, for example, 'immediately' or 'directly' when a temporal relationship is described with 'after', 'following', 'after', 'before', etc. It may include cases that are not continuous unless the expression"

Although the first, second, etc. are used to describe various elements, these elements are not limited by these terms. These terms are only used to distinguish one component from another. Accordingly, the first component mentioned below may be the second component within the spirit of the present invention.

The term "at least one" should be understood to include all possible combinations from one or more related items. For example, the meaning of "at least one of the first, second, and third items" means 2 of the first, second, and third items as well as each of the first, second, or third items. It may mean a combination of all items that can be presented from more than one.

Each feature of the various embodiments of the present invention may be partially or wholly combined or combined with each other, technically various interlocking and driving are possible, and each embodiment may be implemented independently of each other or may be implemented together in a related relationship.

When adding reference numerals to components of each drawing describing embodiments of the present invention, the same components may have the same reference numerals as much as possible even though they are indicated in different drawings.

In embodiments of the present invention, the source electrode and the drain electrode are merely distinguished for convenience of description, and the source electrode and the drain electrode may be interchanged. The source electrode may be the drain electrode, and the drain electrode may be the source electrode. In addition, the source electrode of one embodiment may be a drain electrode in another embodiment, and the drain electrode of one embodiment may be a source electrode in another embodiment.

In some embodiments of the present invention, for convenience of description, a source region and a source electrode are distinguished and a drain region and a drain electrode are distinguished, but embodiments of the present invention are not limited thereto. The source region may be a source electrode, and the drain region may be a drain electrode. Also, the source region may be the drain electrode, and the drain region may be the source electrode.

Each of the features of the various embodiments of the present invention may be partially or wholly combined or combined with each other, and may be technically variously interlocked and driven by those skilled in the art, and each embodiment may be implemented independently of each other or together in a related relationship.

Hereinafter, various embodiments of the present disclosure will be described in detail with reference to the accompanying drawings.

Figure 1:
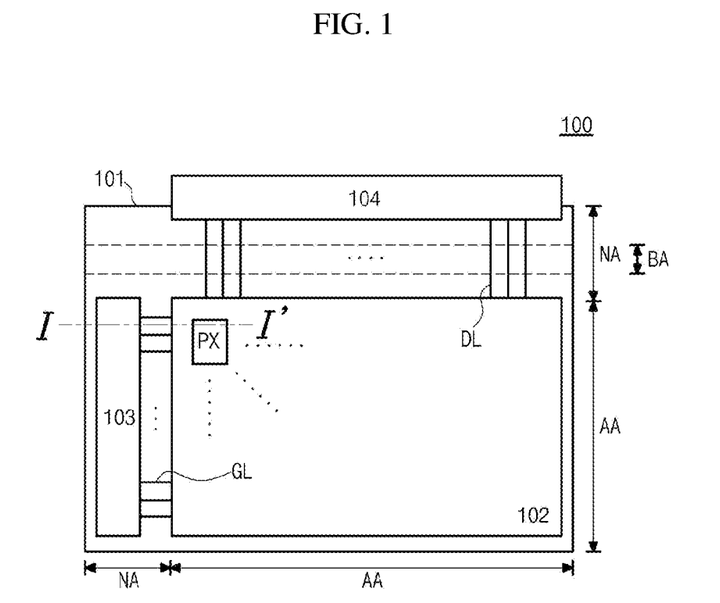
FIG. 1 is a schematic diagram of a display device according to an embodiment of the present disclosure.

FIG. 1 is a plan view illustrating the display device 100 according to the present disclosure.

The display panel 102 includes an active area AA, a non-active area NA around the active area AA on the substrate 101. The substrate 101 is made of a plastic material having flexibility so that the substrate may be bent. For example, the substrate 101 may be formed the material such as include polyimide (PI), polyethylene terephthalate (PET), polyethylene naphthalate (PEN), polycarbonate (PC), polyethersulfone (PES), polyarylate (PAR), polysulfone (PSF), and ciclic- (COC). However, glass is not excluded as the material of the substrate 101.

In the sub pixel in the active area AA, the thin film transistor using the oxide semiconductor material as an active layer is disposed.

One of a data driving unit 104 and a gate driving unit 103 can be disposed in the non-active area NA. Further, the display panel 102 may include bending area BA where the substrate 101 is bent.

Among them, the gate driver 103 may be directly formed on the substrate 101 by forming the thin film transistor using the polycrystalline semiconductor material as the active layer, or the gate driver 103 may include the thin film transistor using the polycrystalline semiconductor material as the active layer and the thin film transistor using oxide semiconductor material as the active layer to form a C-MOS.

The thin film transistor having the oxide semiconductor layer and the thin film transistor having the polycrystalline semiconductor layer have high electron mobility in the channel so that the thin film transistor having high resolution and low power consumption may be fabricated.

A plurality of data lines and gate lines may be disposed in the active area AA. For example, the plurality of data lines may be disposed in a row or in a column. The plurality of gate lines may be disposed in the column or in the row. A sub pixel may be disposed in the area defined by the data line and the gate line.

The gate driving unit 103 including a gate driving circuit may be disposed in the non-active area NA. The gate driving circuit of the gate driving unit 103 sequentially drives each pixel row of the active region by sequentially supplying a scan signal to the plurality of gate lines GL. Here, the gate driving circuit is also referred to as a scan driving circuit. Here, the pixel row refers to the row formed by pixels connected to one gate line.

The gate driving circuit may be composed of the thin film transistor having the polycrystalline semiconductor layer, or may be composed of the thin film transistor having the oxide semiconductor layer. Further, the gate driving circuit may be composed by a pair of the thin film transistor having the polycrystalline semiconductor layer and the thin film transistor having the oxide semiconductor layer. When the thin film transistors disposed in the non-active area NA and the active area AA include the same semiconductor material, the thin film transistors disposed in the non-active area NA and the active area can be simultaneously formed by the same process.

The gate driving circuit can include a shift register and a level shifter, etc.

As the display device according to the embodiment of the present specification, the gate driving circuit may be directly formed on the substrate 101 in GIP (Gate In Panel) type.

The gate driving unit 103 including the gate driving circuit supplies sequentially the scan signal such as an On-voltage or an Off-voltage to the plurality of gate lines.

The display device 100 according to the embodiment of the present specification may further include the data driving circuit. Further, when a specific gate line is opened by the gate driver 103 including the gate driving circuit, the data driving circuit converts image data into analog data voltages and supplies the converted analog data voltage to the plurality of data lines.

The plurality of gate lines GL disposed on the substrate 101 may include a plurality of scan lines and a plurality of emission control lines. The plurality of scan lines and the plurality of emission control lines are wirings that transmit different types of gate signals (e.g., a scan signal and an emission control signal) to gate nodes of different types of transistors (e.g., a scan transistor and an emission control transistor).

The gate driving unit 103 having the gate driving circuit includes a scan driving circuit for outputting the scan signal to the plurality of scan lines which are one type of the gate line GL and a emission driving circuit for outputting the emission controlling signal to a plurality of emission controlling lines which are other type of the gate line GL.

The data line DL may be disposed to pass through the bending area BA. Various data lines DL may be disposed in the bending area BA to be connected to the data pad PAD.

The bending area BA may be an area in which the substrate 101 is bent. The substrate 101 may be maintained in a flat state in the area other than the bending area BA.

Figure 2:
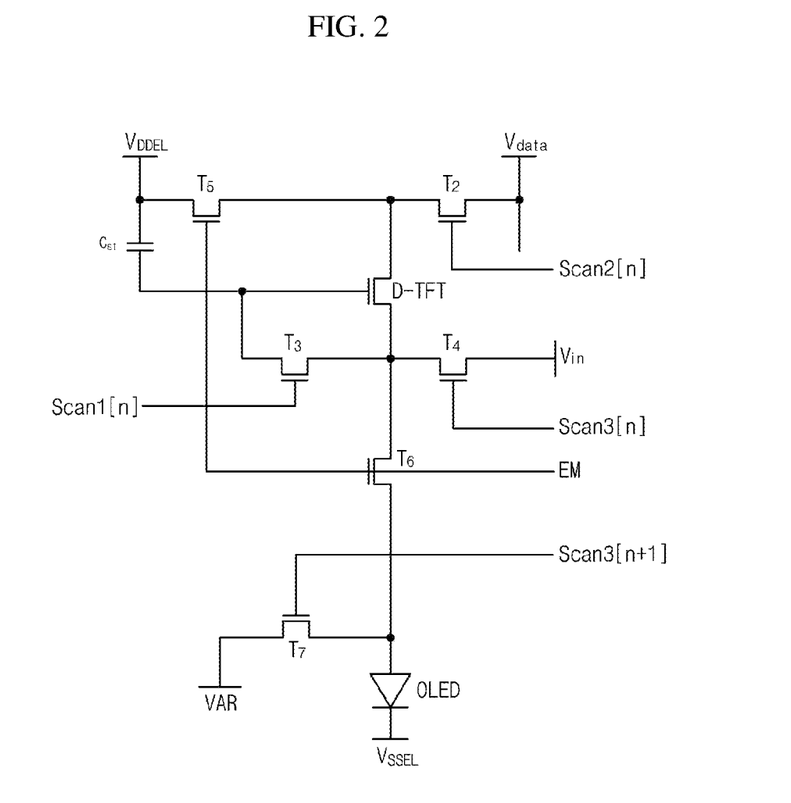
FIG. 2 is a circuit diagram illustrating a pixel driving circuit for driving one pixel in the display device according to the embodiment of the present disclosure.

FIG. 2 is a driving circuit diagram of the sub pixel according to the embodiment of the present invention. In this embodiment, the driving circuit diagram may include seven thin film transistors and one storage capacitor. One of the seven thin film transistors is a driving thin film transistor and the rest are switching thin film transistors for internal compensation.

As an example, in the present disclosure, the structure using the oxide semiconductor pattern as the active layer of the driving thin film transistor (D-TFT) and the T3 switching thin film transistor connected to the gate node of the driving thin film transistor (D-TFT) will be described. In addition, at least one of the remaining switching thin film transistors for internal compensation may use the polycrystalline semiconductor pattern as the active layer.

However, the present invention is not limited to the example shown in FIG. 2 and may be applied to internal compensation circuits of various configurations.

Figure 3:
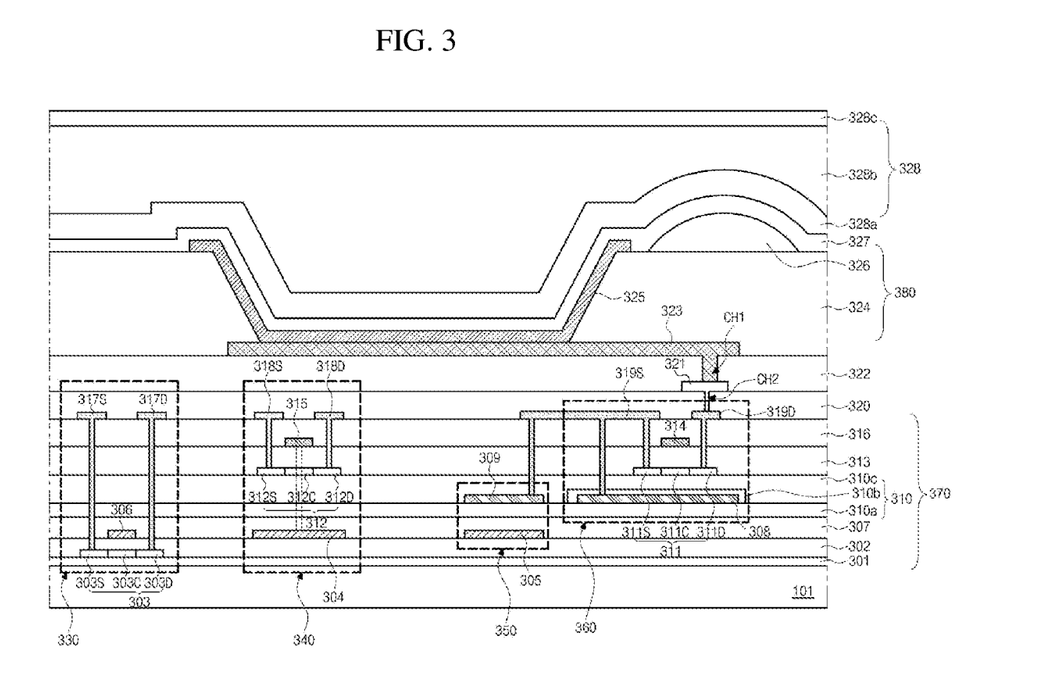
FIG. 3 is a cross sectional view of the display device according to the embodiment of the present disclosure.

FIG. 3 is a cross sectional view of the display device including one driving thin film transistor 360, two switching thin film transistors 330 and 340, and one storage capacitor 350.

One sub pixel PX includes a driving circuit part 370 on the substrate 101 and a light emitting device part 380 electrically connected to the driving unit 370.

The driving circuit part 370 is insulated from the light emitting device part 380 by a planarization layers 320 and 322.

Here, the driving circuit part 370 refers to an array part that drives one sub pixel including the driving thin film transistor, the switching thin film transistor, and the storage capacitor. The light emitting device part 380 refers to the array part for light emission including an anode electrode, a cathode electrode, and a light emitting layer disposed therebetween.

As an example, in FIG. 3, the structure in which the driving circuit part 370 includes one driving thin film transistor 360, two switching thin film transistors 330 and 340, and one storage capacitor 350 is illustrated as an example, but is not limited thereto.

In the embodiment of the present disclosure, the driving thin film transistor 360 and the at least one switching thin film transistor include the active layer formed of the oxide semiconductor pattern. The thin film transistor using the oxide semiconductor material as the active layer has excellent leakage current blocking effect, and manufacturing cost is relatively low compared to the thin film transistor using the polycrystalline semiconductor material as the active layer. Accordingly, in order to reduce power consumption and reduce manufacturing cost, in the embodiment of the present disclosure, the oxide semiconductor material is used to manufacture the driving thin film transistor. At least one switching thin film transistor may be also fabricated using the oxide semiconductor material.

In the driving circuit part in the one sub pixel, all thin film transistors may be made of the oxide semiconductor, and some of the switching thin film transistors may be made of the oxide semiconductor material.

However, the thin film transistor using the oxide semiconductor material has problems with reliability. On the other hand, the thin film transistor using the polycrystalline semiconductor material has a high electron mobility and excellent reliability. In one embodiment of the present invention shown in FIG. 3, one of the switching thin film transistors is manufactured using the oxide semiconductor material and the other is manufactured using the polycrystalline semiconductor material. However, the present invention is not limited to the embodiment shown in FIG. 3.

The substrate 101 may be made of multi-layers in which the organic layer and the inorganic layer are alternately stacked. For example, the substrate 101 may be formed by alternately stacking the organic layer such as polyimide and the inorganic layer such as silicon oxide (SiO2).

A lower buffer layer 301 is disposed on the substrate 101. The lower buffer layer 301 may be made of multi-layers such as silicon oxide (SiO2) to block moisture from outside.

A second buffer layer (not shown) can be further provided on the lower buffer layer 301 to more reliably protect the device from moisture.

A first switching thin film transistor 330 is formed on the substrate 101. The first switching thin film transistor 330 may include the active layer formed of the polycrystalline semiconductor pattern. The first switching thin film transistor 330 includes the first active layer 303 including a channel through which electrons or holes move, a first gate electrode 306, a first source electrode 317S, and a first drain electrode 317D.

The first active layer 303 is made of the polycrystalline semiconductor material. A first channel region 303C is disposed in the center of the first active layer 303, and a first source region 303S and a first drain region 303D are disposed on both sides of the first channel region 303C.

The first source region 303S and the first drain region 303D are conductively formed by doping the intrinsic polycrystalline semiconductor pattern with an impurity ion of Group 5 or Group 3 such as phosphorus (P) or boron (B) at a predetermined concentration.

In the first channel region 303C, the polycrystalline semiconductor material maintains an intrinsic state to form a path through which electrons or holes move.

Meanwhile, the first switching thin film transistor 330 includes the first gate electrode 306 overlapping the first channel region 303C of the first active layer 303. A first gate insulating layer 302 is interposed between the first gate electrode 306 and the first active layer 303.

In the embodiment of the present disclosure, the first switching thin film transistor 330 is formed in a top gate type in which the first gate electrode 306 is positioned on the first active layer 303. As a result, since the first gate electrode 306 and the second light blocking layer 304 which are made of the first gate electrode material may be formed by one mask process, it is possible to reduce the mask process.

The first gate electrode 306 is made of a metal. For example, the first gate electrode 306 may be a single layer or multi-layers made of any or an alloy of metal such as molybdenum (Mo), aluminum (Al), chromium (Cr), gold (Au), titanium (Ti), nickel (Ni), neodymium (Nd), and copper (Cu), but is not limited thereto.

A first interlayer insulating layer 307 is deposited on the first gate electrode 306. The first interlayer insulating layer 307 may be formed of silicon nitride (SiNx). In particular, the first interlayer insulating layer 307 made of silicon nitride (SiNx) may include hydrogen particles. When the heat treatment process is performed after forming the first active layer 303 and depositing the first interlayer insulating layer 307 thereon, the hydrogen particles included in the first interlayer insulating layer 307 are transferred into the first source region 303S and the first drain region 303D to improve and stabilize the conductivity of the polycrystalline semiconductor material. This is called a hydrogenation process.

The first switching thin film transistor 330 may further include an upper buffer layer 310, a second gate insulating layer 313, and a second interlayer insulating layer 316 sequentially disposed on the first interlayer insulating layer 307. Further, the first switching thin film transistor 330 includes a first source electrode 317S and a first drain electrode 317D on the second interlayer insulating layer 316 connected respectively to the first source region 303S and the first drain region 303D.

The first active layer 303 made of the polycrystalline semiconductor material is spaced apart from the second active layer 312 of the second switching thin film transistor 340 made of the oxide semiconductor material and the third active layer 311 of the driving thin film transistor 360 by the upper buffer layer 310. Further, the upper buffer layer 310 provides a base on which the second active layer 312 and the third active layer 311 are formed.

The second interlayer insulating layer 316 covers the second gate electrode 315 of the second switching thin film transistor 340 and the third gate electrode 314 of the driving thin film transistor 360. Since the second interlayer insulating layer 316 is formed on the second active layer 312 and the third active layer 311 which are made of the oxide semiconductor material, it is made of an inorganic layer that does not include hydrogen particles.

The first source electrode 317S and the first drain electrode 317D may be the single layer or the multi layers mad of any one or the alloy of molybdenum (Mo), aluminum (Al), chromium (Cr), gold (Au), titanium (Ti), nickel (Ni), neodymium (Nd) and copper (Cu), but is not limited these materials.

The second switching thin film transistor 340 is formed on the upper buffer layer 310. The second switching thin film transistor 340 includes the second active layer 312 made of a second oxide semiconductor pattern, the second gate insulating layer 313 covering the second active layer 312, a second gate electrode 315 on the second gate insulating layer 313, the second interlayer insulating layer 316 covering the second gate electrode 315, and a second source electrode 318S and a second drain electrode 318D on the second interlayer insulating layer 316.

The second switching thin film transistor 340 further includes a second light blocking layer 304 overlapped with the second active layer 312. The second light blocking layer 304 may be formed of the same material as the first gate electrode 306 on the upper surface of the first gate insulating layer 302.

The second gate electrode 315 may form a single gate structure. But in the embodiment of FIG. 3, the second light blocking layer 304 may be connected to the second gate electrode 315 to form a dual gate structure. Since the second switching thin film transistor has the dual gate structure, the current flowing the second channel layer 312c may be controlled more precisely and the second switching thin film transistor may be fabricated in smaller size, thereby a high-resolution display device may be fabricated.

The second active layer 312 is made of the oxide semiconductor material. The second active layer 312 includes the intrinsic second channel region 312C which is not doped with impurities, and a second source region 312S and a second drain region 312D which are conductorized.

The second source electrode 318S and the second drain electrode 318D may be formed of the same material as the first source electrode 317S and the first drain electrode 317D. That is, the second source electrode 318S and the second drain electrode 318D may be the single layer or the multi layers made of any one or the alloy of metals such as molybdenum (Mo), aluminum (Al), chromium (Cr), gold (Au), titanium (Ti), nickel (Ni), neodymium (Nd), and copper (Cu).

The second source electrode 318S and the second drain electrode 318D are simultaneously made of the same material as the first source electrode 317S and the first drain electrode 317D on the second interlayer insulating layer 316, so that the number of the mask process may be reduced.

The driving thin film transistor 360 is formed on the upper buffer layer 310.

In an embodiment of the present invention, the driving thin film transistor includes a third active layer 311 formed of the first oxide semiconductor pattern. Here, since the first oxide semiconductor pattern and the third active layer are substantially the same, the same reference numerals are used for description.

A conventional driving thin film transistor uses a polycrystalline semiconductor pattern advantageous for high-speed operation as an active layer. However, since the leakage current is generated in the off state in the driving thin film transistor including the polycrystalline semiconductor pattern, there was the problem that power consumption is large. Accordingly, in an embodiment of the present invention, the driving thin film transistor including the active layer made of the oxide semiconductor pattern is proposed to prevent the leakage current.

However, in the case of the thin film transistor including the active layer made of the oxide semiconductor pattern, the current variation value for a unit voltage variation value becomes large due to the material properties of the oxide semiconductor, and thus the defect occurs in a low grayscale region where precise current control is required. Accordingly, in one embodiment of the present disclosure, the driving thin film transistor in which the current variation value of the active layer is relatively insensitive to the voltage variation value applied to the gate electrode is provided.

Referring to FIG. 3, the driving thin film transistor 360 includes the third active layer 311 formed of the first oxide semiconductor pattern on the upper buffer layer 310, the second gate insulating layer 313 covering the third active layer 311 (the first oxide semiconductor pattern), the third gate electrode 314 formed on the second gate insulating layer 313 to overlap the second active layer 311, and a third source electrode 319S and a third drain electrode 319D disposed on the second interlayer insulating layer 316.

In particular, the driving thin film transistor 360 further includes a first light blocking layer 308 disposed inside the upper buffer layer 310 to be overlapped with the third active layer 311.

The first light blocking layer 308 is substantially inserted into the upper buffer layer 310. That is, the first light blocking layer 308 is formed on a first sub-upper buffer layer 310a disposed on the first interlayer insulating layer 307. A second sub-upper buffer layer 310b may completely cover the upper surface of the first light blocking layer 308, and the third sub-upper buffer layer 310c is formed on the second sub-upper buffer layer 310b.

In other words, the upper buffer layer 310 has the structure in which the first sub-upper buffer layer 310a, the second sub-upper buffer layer 310b, and the third sub-upper buffer layer 310c are sequentially stacked.

The first sub-upper buffer layer 310a and the third sub-upper buffer layer 310c may be made of silicon oxide (SiO2).

The first sub-upper buffer layer 310a and the third sub-upper buffer layer 310c are made of silicon oxide (SiO2) that does not contain hydrogen particles. Thus, the first sub-upper buffer layer 310a and the third sub-upper buffer layer 310c may be the base of the second switching thin film transistor 340 and the driving thin film transistor 360 having the active layer made of oxide semiconductor pattern of which reliability may be damaged by hydrogen particles.

On the other hand, the second sub-upper buffer layer 310b is made of the silicon nitride (SiNx) having an excellent hydrogen particle trapping ability. The second sub-upper buffer layer 310b covers both the top surface and the side surface of the first light blocking layer 308 to completely seal the first light blocking layer 308. The silicon nitride (SiNx) has a better hydrogen particle trapping ability than the silicon oxide (SiO2).

The first interlayer insulating layer 307 including hydrogen particles is positioned under the upper buffer layer 310.

In the first switching thin film transistor 330 having the active layer using the polycrystalline semiconductor pattern, since hydrogen particles generated during the hydrogenation process penetrate through the upper buffer layer 310, the oxide semiconductor pattern disposed on the upper buffer layer 310 may be damaged by the penetrated hydrogen particles. That is, when the hydrogen particles penetrate the oxide semiconductor pattern, the threshold voltage or channel conductivity of the thin film transistors having the active layer using the oxide semiconductor pattern varies depending on the formation location thereof. However, since the driving thin film transistor is directly related to the operation of the light emitting device, it is important to secure reliability.

Therefore, in the embodiment of the present invention, the second sub-upper buffer layer 310b completely covering the first light blocking layer 308 is partially formed on the first sub-upper buffer layer 310a, so that the damage of the reliability of the driving thin film transistor 360 by hydrogen particles may be prevented.

Further, in the embodiment of the present disclosure, the first light blocking layer 308 is formed of the metal layer including a titanium (Ti) material having excellent hydrogen particle trapping ability. For example, the first light blocking layer 308 may be formed of the single layer of titanium, the multilayer of molybdenum (Mo) and titanium (Ti), or the alloy of molybdenum (Mo) and titanium (Ti). However, the present invention is not limited thereto, and the first light blocking layer 308 may be formed of another metal layer including titanium (Ti).

Titanium (Ti) traps hydrogen particles diffusing in the upper buffer layer 310 to block the hydrogen particles to the first oxide semiconductor pattern 311. Therefore, in the driving thin film transistor 360 according to the embodiment of the present invention, the first light blocking layer 308 is formed of the metal layer such as titanium capable of trapping the hydrogen particles and of silicon nitride (SiNx) layer capable of trapping the hydrogen particles and silicon nitride to cover the first light blocking layer 308, so that the reliability of the oxide semiconductor pattern caused by the hydrogen particles improved.

The second sub-upper buffer layer 310b including silicon nitride (SiNx) may be not deposited on the entire surface of the display area, but is deposited only on a portion of the top surface of the first sub buffer layer 310a to cover selectively only the first light blocking layer 308. The second sub-upper buffer layer 310b is formed of the material different from that of the first sub-upper buffer layer 310a, that is, the silicon nitride (SiNx) layer. Therefore, when the second sub-upper buffer layer 310b is deposited over the entire display area, a film lifting (detachment) may occur. To solve this problem, the second sub-upper buffer layer 310b may be selectively formed only in the region where the first light blocking layer 308 is formed, which is the region necessary for its function.

In consideration of a functional aspect, it is preferable to form the first light blocking layer 308 and the second sub-upper buffer layer 310b vertically below the first oxide semiconductor pattern 311 to overlap the first oxide semiconductor pattern 311. Further, the first light blocking layer 308 and the second sub-upper buffer layer 310 may be larger than the first oxide semiconductor pattern 310 to completely overlap the first oxide semiconductor pattern 310.

The third source electrode 319S of the driving thin film transistor 360 may be electrically connected to the first light blocking layer 308.

As described above, when the first light blocking layer 308 is disposed inside the upper buffer layer 310 and the third source electrode 319S is electrically connected to the first light blocking layer 308, the following additional effects may be obtained, which will be described below with reference to FIGS. 4A and 4B.

Figure 4A:
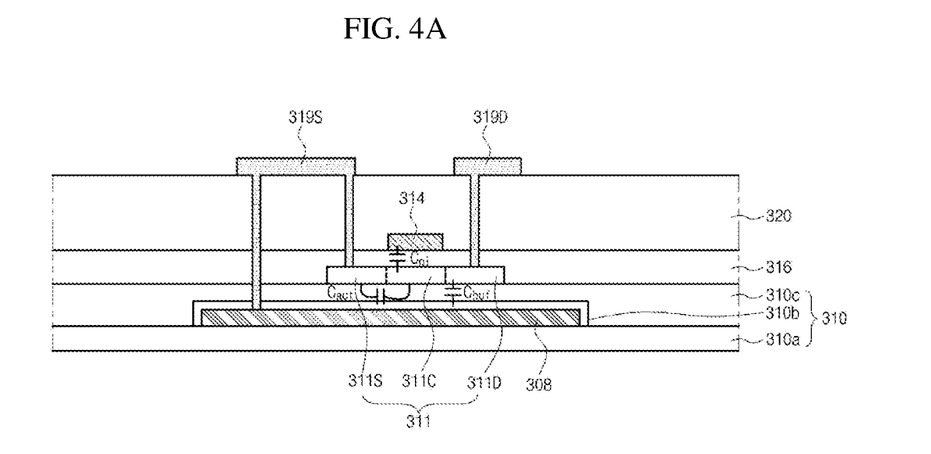
FIG. 4A is a cross sectional view illustrating a driving thin film transistor according to the embodiment of the present disclosure.

FIG. 4A is a cross sectional view of the driving thin film transistor shown in FIG. 3. FIG. 4B is a circuit diagram illustrating a relationship between a parasitic capacitance generated in the driving thin film transistor and a voltage applied thereto.

Referring to FIG. 4A, when the third source region 311S and the third drain region 311D of the first oxide semiconductor pattern 311 are conductorized, the parasitic capacitance Cact is generated inside the first oxide semiconductor pattern 311, and the parasitic capacitance Cgi is generated between the third gate electrode 314 and the first oxide semiconductor pattern 311. Further, the parasitic capacitance Cbuf is generated between the first light blocking layer 308 and the first oxide semiconductor pattern 311. And the third source electrode 319S is electrically connected to the first oxide semiconductor pattern 311.

Figure 4B:
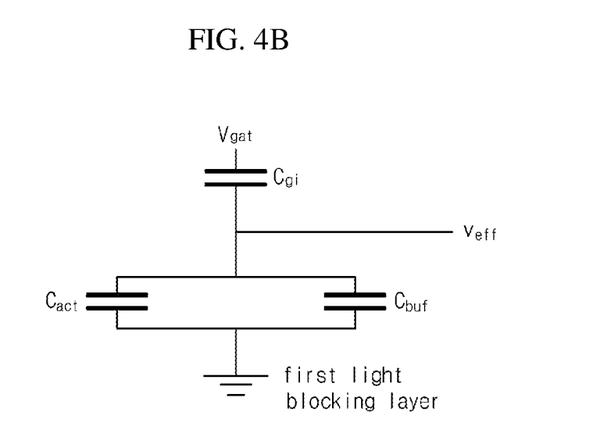
FIG. 4B is a circuit diagram illustrating a connection relationship between parasitic capacitors generated in the driving thin film transistor of the present disclosure.

Since the first oxide semiconductor pattern 311 and the first light blocking layer 308 are electrically connected via the third source electrode 319S, the parasitic capacitance Cact and the parasitic capacitance Cbuf are connected in parallel to each other, and the parasitic capacitance Cact and the parasitic capacitance Cgi is connected in series to each other, as shown in FIG. 4B. Further, when a gate voltage of $V_{gat}$ is applied to the third gate electrode 314, the effective voltage Veff(ΔV) actually applied to the first oxide semiconductor pattern 311 is calculated by the following formula.

$$\Delta Veff = \frac{Cgi}{Cgi + Cbuf + Cact} * \Delta Vgat$$

Accordingly, since the effective voltage applied to the channel of the third active layer 311 is inversely proportional to the parasitic capacitance Cbuf, the effective voltage applied to the first oxide semiconductor pattern 311 may be adjusted by the parasitic capacitance Cbuf.

That is, if the parasitic capacitance value Cbuf is increased by disposing the first light blocking layer 308 close to the first oxide semiconductor pattern 311, the actual current value flowing through the first oxide semiconductor pattern 311 may be reduced.

The reduction of the effective current flowing through the first oxide semiconductor pattern 311 means that the control range of the driving thin film transistor 360 to be controlled by the voltage Vgat actually applied to the third gate electrode 314 is widened.

Therefore, in the embodiment of the present invention, since the first light blocking layer 308 is disposed closer to the first oxide semiconductor pattern 311 than to the second light blocking layer 304 in the second switching thin film transistor 340, the grayscale control range of the driving thin film transistor 360 is widened. As a result, since the light emitting device may be precisely controlled even at a low gray level, it is possible to solve the problem of screen unevenness that occurs frequently at a low gray level. To sum up, a parasitic capacitance (Cbuf) generated between the first oxide semiconductor pattern and the first light blocking layer may be larger than a parasitic capacitance (Cgi) generated between the third gate electrode and the first oxide semiconductor pattern.

Meanwhile, referring to FIG. 3, the driving circuit part 370 according to the embodiment of the present invention further includes a storage capacitor 350.

The storage capacitor 350 stores the data voltage applied through the data line for a certain period of time and then provides it to the light emitting device.

The storage capacitor 350 includes two electrodes corresponding to each other and a dielectric disposed therebetween. The storage capacitor 350 includes a first storage electrode 305 made of the same material as the first gate electrode 306 on the same layer, and a second storage electrode 309 made of the same material as the first light blocking layer 308 on the same layer.

The first interlayer insulating layer 307 and the upper first sub buffer layer 310a are positioned between the first storage electrode 305 and the second storage electrode 309.

The first storage electrode 309 of the storage capacitor 350 may be electrically connected to the third source electrode 319S.

Figure 5:
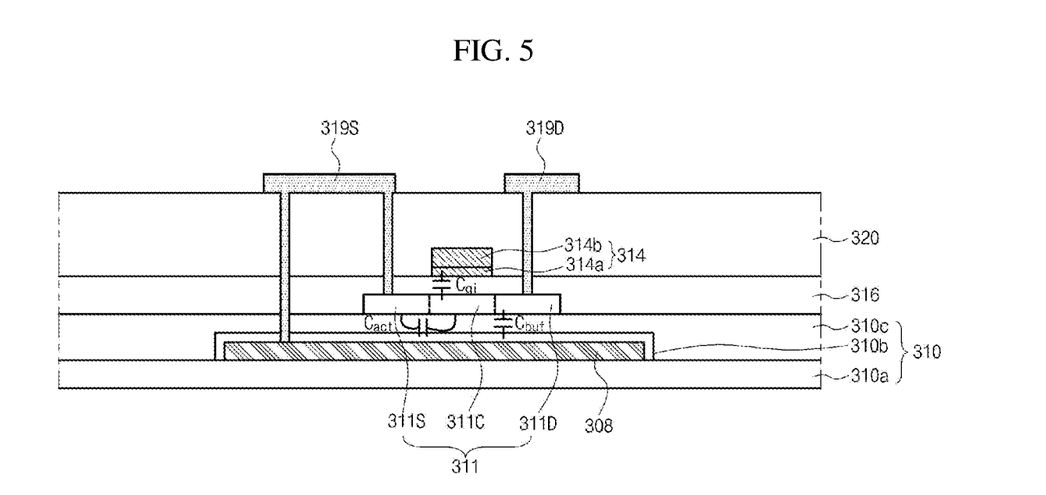
FIG. 5 is a cross sectional view of the driving thin film transistor according to another embodiment of the present disclosure.

Meanwhile, referring to FIG. 5, in another embodiment of the present invention, the third gate electrode 314 may include a plurality of layers having a layer containing titanium (Ti).

That is, the third gate electrode 314 is formed a multilayer having a lower third gate electrode 314a including titanium (Ti) and an upper third gate electrode 314b including a metal different from titanium, for example, molybdenum (Mo).

When the third gate electrode 314 is formed of a plurality of metal layers including titanium, the metal layer including titanium blocks hydrogen particles penetrating from the upper portion of the driving thin film transistor 360, the oxide semiconductor pattern may be protected from the hydrogen particles.

The configuration of the driving circuit part 370 of the unit pixel of the present invention has been described above. Since the driving circuit part 370 includes a plurality of thin film transistors having different types of semiconductor materials, the driving circuit part 370 was formed in a plurality of layers and thus large number of masks should be necessary to form the driving circuit part 370. On the embodiment of the present invention, however, since a plurality of layers are simultaneously formed, the number of masks can be reduced as much as possible.

That is, the first gate electrode 306 constituting the first switching thin film transistor 330, the second light blocking layer 340 constituting the second switching thin film transistor 340, and the first storage electrode 305 constituting the storage capacitor 350 are formed on the same layer using the same material. Further, the second storage electrode 309 constituting the storage capacitor 350 and the first light blocking layer 308 constituting the driving thin film transistor 360 are formed on the same layer using the same material. In addition, the second gate electrode 315 constituting the second switching thin film transistor 340 and the third gate electrode 314 constituting the driving thin film transistor 360 are formed on the same layer using the same material.

Further, the first source electrode 317S and the first drain electrode 317D constituting the first switching thin film transistor 330, the second source electrode 318S and the second drain electrode 318D constituting the second switching thin film transistor 340, and the third source electrode 319S and the third drain electrode 319D constituting the driving thin film transistor 360 are formed on the same layer using the same material.

Meanwhile, referring to FIG. 3, the first planarization layer 320 and the second planarization layer 322 are sequentially formed on the driving circuit part 370 to planarize the upper portion of the driving device unit 37. The first planarization layer 320 and the second planarization layer 322 may be formed of an organic layer such as polyimide or acrylic resin.

Referring to FIG. 3, the light emitting device part 380 is formed on the second planarization layer 322.

The light emitting device part 380 includes the first electrode 323 as an anode electrode, the second electrode 327 as a cathode electrode corresponding to the first electrode 323, and the light emitting layer 325a between the first electrode 323 and the second electrode 327. The first electrode 323 is formed at each sub pixel.

The light emitting device part 380 is connected to the driving circuit part 370 through the connection electrode 321 on the first planarization layer 320. In particular, the first electrode 323 of the light emitting device part 380 and the third drain electrode 319D of the driving thin film transistor 360 constituting the driving circuit part 370 are connected to each other by the connection electrode 321.

The first electrode 323 is connected to the connection electrode 321 through the contact hole CH1 passing through the second planarization layer 322. The connection electrode 321 is connected to the third drain electrode 319D through the contact hole CH2 passing through the first planarization layer 320.

The first electrode 323 may be formed in a multi-layered structure including a transparent conductive layer and an opaque conductive layer having high reflection efficiency. The transparent conductive layer may be formed of the material having a relatively large work function value, such as indium-tin-oxide (ITO) or indium-zinc-oxide (IZO). The opaque conductive layer may be formed of the single layer or the multiple layers including Al, Ag, Cu, Pb, Mo, Ti, or an alloy thereof. For example, the first electrode 323 may be formed by sequentially depositing the transparent conductive layer, the opaque conductive layer, and the transparent conductive layer, or may be formed by sequentially depositing the transparent conductive layer and the opaque conductive layer.

The emission layer 325 is formed by depositing the hole-related layer(s), the organic emission layer, and the electron-related layer(s) on the first electrode 323 in the order or in the reverse order.

The bank layer 324 is a pixel-defining layer exposing the first electrode 323 at each sub pixel. The bank layer 324 may be formed of the opaque material (e.g., black) to prevent optical interference between adjacent sub pixels. In this case, the bank layer 324 includes a light blocking material made of at least one of a color pigment, an organic black material, and carbon. The spacer 326 may be further disposed on the bank layer 324.

The second electrode 327 serving as the cathode faces the first electrode 323 with the light emitting layer 325 interposed therebetween and is formed on the upper surface and the side surface of the light emitting layer 325. The second electrode 327 may be integrally formed on the entire surface of the active region. When applied to the top emission type organic light emitting display device, the second electrode 327 may be formed of the transparent conductive layer such as indium-tin-oxide (ITO) or indium-zinc-oxide (IZO).

An encapsulating layer 328 for blocking moisture penetration may be further disposed on the second electrode 327.

The encapsulating unit 328 may include a first inorganic encapsulating layer 328a, a second organic encapsulating layer 328b, and a third inorganic encapsulating layer 328c which are sequentially deposited.

The first inorganic encapsulating layer 328a and the third inorganic encapsulating layer 328c may be formed of inorganic material such as silicon oxide (SiOx). The second organic encapsulating layer 328b may be formed of organic material such as acrylic resin, epoxy resin, phenolic resin, polyamide resin, and polyimide resin.

The above description and the accompanying drawings are merely illustrative of the technical spirit of the present invention, and those of ordinary skill in the art to which the present invention pertains can combine configurations within a range that does not depart from the essential characteristics of the present invention, various modifications or variations such as separation, substitution and alteration will be possible. Therefore, the embodiments disclosed in the present invention are not intended to limit the technical spirit of the present invention, but to explain, and the scope of the technical spirit of the present invention is not limited by these embodiments. The protection scope of the present invention should be construed by the following claims, and all technical ideas within the scope equivalent thereto should be construed as being included in the scope of the present invention.

What is claimed is:

1. An organic light emitting display device, comprising:
a plurality of pixels each including a light emitting device connected to a data line crossing with a gate line;
a driving transistor disposed at each pixel, the driving transistor having a first oxide semiconductor pattern and supplying driving current to the light emitting device according to a data voltage applied from the data line; and
a plurality of switching transistors disposed at each pixel, the switching transistors including a first switching transistor and a second switching transistor supplying the data voltage according to a gate signal applied from the gate line;
wherein the second switching transistor includes a second oxide semiconductor pattern,
wherein the driving transistor includes a first light blocking layer overlapped with the first oxide semiconductor pattern at a lower portion of the first oxide semiconductor pattern, and the second switching transistor includes a second light blocking layer overlapped with the second oxide semiconductor pattern in a lower portion of the second oxide semiconductor pattern,
wherein the first oxide semiconductor pattern and the second oxide semiconductor pattern are disposed on a same layer, and the first light blocking layer and the second light blocking layer are disposed on different layers, so that a first distance between the first oxide semiconductor pattern and the first light blocking layer is smaller than a second distance between the second oxide semiconductor pattern and the second light blocking layer,
wherein the organic light emitting display device further comprises:
a silicon nitride layer deposited only on an upper surface and side surfaces of the first light blocking layer; and an insulating layer disposed under the first oxide semiconductor pattern to enclose an upper surface and side surfaces of the silicon nitride layer.

2. The organic light emitting display device of claim 1, wherein the first switching transistor includes a first gate electrode, a first source electrode, and a first drain electrode;
wherein the second switching transistor includes the second oxide semiconductor pattern on an upper buffer layer, a second gate electrode overlapped with the second oxide semiconductor pattern with a second gate insulating layer interposed between the second gate electrode and the second oxide semiconductor pattern, a second interlayer insulating layer on the second gate electrode, and a second source electrode and a second drain electrode on the second interlayer insulating layer;
wherein the driving transistor includes the first oxide semiconductor pattern on the upper buffer layer, a third gate electrode overlapped with the first oxide semiconductor pattern with the second gate insulating layer interposed between the third gate electrode and the first oxide semiconductor pattern, and a third source electrode and a third drain electrode connected to the first oxide semiconductor pattern on the second interlayer insulating layer; and
wherein the third source electrode is connected to the first light blocking layer.

3. The organic light emitting display device of claim 2, wherein the first switching transistor includes a polycrystalline semiconductor pattern.

4. The organic light emitting display device of claim 3, wherein the first switching transistor includes the polycrystalline semiconductor pattern on a substrate, a first gate electrode overlapped with the polycrystalline semiconductor pattern with a first gate insulating layer interposed between the first gate electrode and the polycrystalline semiconductor pattern, a first interlayer insulating layer on the first gate electrode, the upper buffer layer on the first interlayer insulating layer, and the first source electrode and the first drain electrode on the upper buffer layer connected to the polycrystalline semiconductor pattern.

5. The organic light emitting display device of claim 2, wherein the first light blocking layer is disposed inside of the upper buffer layer and the second light blocking layer is disposed below the upper buffer layer.

6. The organic light emitting display device of claim 4, wherein the first light blocking layer is disposed inside of the upper buffer layer and the second light blocking layer is disposed on an upper surface of the first gate insulating layer.

7. The organic light emitting display device of claim 4, further comprising:
a storage capacitor including a first capacitor electrode disposed on a same layer as the first gate electrode and a second capacitor electrode disposed on a same layer as the first light blocking layer.

8. The organic light emitting display device of claim 2, wherein a parasitic capacitance ($C_{buf}$) generated between the first oxide semiconductor pattern and the first light blocking layer is larger than a parasitic capacitance ($C_{gi}$) generated between the third gate electrode and the first oxide semiconductor pattern.

9. The organic light emitting display device of claim 6, wherein the second gate electrode is electrically connected to the second light blocking layer.

10. The organic light emitting display device of claim 5, wherein the upper buffer layer includes a first sub-upper buffer layer below the first light blocking layer and a second sub-upper buffer layer and a third sub-upper buffer layer on the first light blocking layer.

11. The organic light emitting display device of claim 10, wherein the second sub-upper buffer layer covers only a top surface and side surfaces of the first light blocking layer.

12. The organic light emitting display device of claim 11, wherein the second sub-upper buffer layer includes silicon nitride layer, and the first sub-upper buffer layer and the third sub-upper buffer layer include silicon oxide layer.

13. The organic light emitting display device of claim 12, wherein the first light blocking layer includes titanium (Ti).

14. The organic light emitting display device of claim 8,
wherein a parasitic capacitance ($C_{act}$) generated inside of the first oxide semiconductor pattern is connected in parallel with a parasitic capacitance ($C_{buf}$) generated between the first oxide semiconductor pattern and the first light blocking layer, and
wherein the parasitic capacitance ($C_{act}$) is connected in series with a parasitic capacitance ($C_{gi}$) generated between the third gate electrode and the first oxide semiconductor pattern.

15. The organic light emitting display device of claim 7, wherein the second capacitor electrode is electrically connected to the third source electrode.

16. The organic light emitting display device of claim 2, wherein the third gate electrode includes a plurality of conductive layers and at least one of the conductive layers includes titanium.

17. An organic light emitting display device, comprising:
a plurality of pixels each including a light emitting device connected to a data line crossing with a gate line;
a driving transistor disposed at each pixel, the driving transistor including a first oxide semiconductor pattern and supplying driving current to the light emitting device according to a data voltage applied from the data line;
a first light blocking layer overlapped with the first oxide semiconductor pattern at a lower portion of the first oxide semiconductor pattern, the first light blocking layer including titanium,
a silicon nitride layer deposited only on an upper surface and side surfaces of the first light blocking layer; and
an insulating layer disposed under the first oxide semiconductor pattern to enclose the upper surface and the side surfaces of the silicon nitride layer.

18. The organic light emitting display device of claim 17, wherein the driving transistor includes:
the first oxide semiconductor pattern on a substrate;
a gate electrode overlapped with the first oxide semiconductor pattern with a gate insulating layer interposed therebetween;
at least one interlayer insulating layer over the gate electrode; and
a source electrode and a drain electrode connected to the first oxide semiconductor pattern,
wherein the source electrode is electrically connected to the first light blocking layer.

19. The organic light emitting display device of claim 18, wherein the gate electrode includes at least one conductive layer having titanium.

20. The organic light emitting display device of claim 18, further comprising a plurality of switching transistors for supplying a data voltage according to a gate signal applied to the gate line, wherein the plurality of switching transistors include one switching transistor having a second oxide semiconductor pattern.

21. An organic light emitting display device comprising a plurality of pixels emitting light in a first direction, at least one of the pixels comprising:
   a first switching transistor including a polycrystalline semiconductor pattern;
   a second switching transistor including a first oxide semiconductor pattern; and
   a driving transistor including a second oxide semiconductor pattern, a gate electrode above the second oxide semiconductor pattern in the first direction, and a first reflective, conductive layer under the second oxide semiconductor pattern in a second direction opposite the first direction,
   wherein the first reflective, conductive layer is electrically connected to the second oxide semiconductor pattern,
   wherein the first oxide semiconductor pattern and the second oxide semiconductor pattern are disposed on a same layer,
   wherein the driving transistor includes a light blocking layer overlapped with the second oxide semiconductor pattern at a lower portion of the second oxide semiconductor pattern, and
   wherein the organic light emitting display device further comprises:
      a silicon nitride layer deposited only on an upper surface and side surfaces of the light blocking layer; and
      an insulating layer disposed under the second oxide semiconductor pattern to enclose an upper surface and side surfaces of the silicon nitride layer.

22. The organic light emitting display device of claim 21, wherein:
   the driving transistor includes a source electrode, a drain electrode, and a gate electrode; and
   the first reflective, conductive layer is electrically connected to the second oxide semiconductor pattern via the source electrode of the driving transistor.

23. The organic light emitting display device of claim 21, wherein the at least one of the pixels further comprises an interlayer insulating layer including hydrogen particles, the interlayer insulating layer disposed above the polycrystalline semiconductor pattern of the first switching transistor in the first direction, under the first oxide semiconductor pattern of the second switching transistor in the second direction, and under both the second oxide semiconductor pattern and the first reflective, conductive layer of the driving transistor in the second direction.

24. The organic light emitting display device of claim 23, wherein the interlayer insulating layer includes silicon nitride (SiNx), and the first reflective, conductive layer includes titanium.

25. The organic light emitting display device of claim 23, wherein:
   the second switching transistor further including a second reflective, conductive layer under the first oxide semiconductor pattern in the second direction; and
   the first reflective, conductive layer and the second reflective, conductive layer are disposed on different layers, so that a first distance between the second oxide semiconductor pattern and the first reflective, conductive layer of the driving transistor is smaller than a second distance between the first oxide semiconductor pattern and the second reflective, conductive layer.

26. The organic light emitting display device of claim 25, wherein the at least one of the pixels further comprises a storage capacitor including a first capacitor electrode and a second capacitor electrode; wherein:
   the interlayer insulating layer is disposed between the first capacitor electrode and the second capacitor electrode;
   the first capacitor electrode is in a same layer as the second reflective, conductive layer of the second switching transistor; and
   the second capacitor electrode is in a same layer as the first reflective, conductive layer of the driving transistor.

* * * * *